US010654034B2

(12) United States Patent
Nefedkin et al.

(10) Patent No.: US 10,654,034 B2
(45) Date of Patent: May 19, 2020

(54) METHOD OF PREPARING PLATINUM-BASED CATALYST AND PLATINUM-BASED CATALYST

(71) Applicant: AT ENERGY, LLC, Moscow (RU)

(72) Inventors: Sergey Ivanovich Nefedkin, Moscow (RU); Danila Yuryevich Shaposhnikov, Moscow (RU); Alexandra Valeryevna Nefedkina, Moscow (RU)

(73) Assignee: AT ENERGY LLC, Moscow (RU)

( * ) Notice: Subject to any disclaimer, the term of this patent is extended or adjusted under 35 U.S.C. 154(b) by 282 days.

(21) Appl. No.: 15/315,065

(22) PCT Filed: May 30, 2014

(86) PCT No.: PCT/RU2014/000401
§ 371 (c)(1),
(2) Date: Nov. 30, 2016

(87) PCT Pub. No.: WO2015/183128
PCT Pub. Date: Dec. 3, 2015

(65) Prior Publication Data
US 2017/0216831 A1 Aug. 3, 2017

(51) Int. Cl.
*C23C 14/34* (2006.01)
*B01J 37/34* (2006.01)
(Continued)

(52) U.S. Cl.
CPC ............ *B01J 37/342* (2013.01); *B01J 23/42* (2013.01); *B82Y 40/00* (2013.01);
(Continued)

(58) Field of Classification Search
CPC .......... C23C 14/35; C23C 14/08; C23C 14/14
See application file for complete search history.

(56) References Cited

U.S. PATENT DOCUMENTS 3,773,639 A 11/1973 Masotti
4,965,142 A * 10/1990 Schmatz ................. C23C 14/08
204/192.3
(Continued)

FOREIGN PATENT DOCUMENTS

RU 2 367 520 C1 9/2009
RU 2 421 849 C1 6/2011
(Continued)

OTHER PUBLICATIONS

Saenger, K.L., et al; "Properties and Decomposition Behaviors of Reactively Sputtered Pt(O) Electrode Materials"; *Mat. Res. Soc. Symp. Proc.*, vol. 596, pp. 57-65 (2000).
(Continued)

*Primary Examiner* — Jason Berman
(74) *Attorney, Agent, or Firm* — Nixon & Vanderhye P.C.

(57) ABSTRACT

The invention relates to the method of forming a platinum-based catalytic coating on electrodes for using in electro-chemical devices such as fuel cells or electrolysis cells. According to the invention, to produce a platinum-based catalyst, the carrier is preliminary cleaned by ion etching and the catalytic coating is applied onto the cleaned surface from at least one target based on platinum in vacuum in the primary gas plasma with addition of reactive gas, sputtering being done at the power density on the magnetron sputtered target within $(0.004\text{-}0.17)*10^5$ W/m² and the ratio of concentrations of the primary and reaction gas of 75-99%. Technical result: increased specific catalytic activity of the electrode's catalytic coating for electrochemical devices (fuel cells and electrolysis cells).

18 Claims, 3 Drawing Sheets

(51) Int. Cl.
*B82Y 40/00* (2011.01)
*C23C 14/14* (2006.01)
*C23C 14/08* (2006.01)
*C23C 14/35* (2006.01)
*B01J 23/42* (2006.01)
*C23C 14/00* (2006.01)
*C23C 14/16* (2006.01)
*C23C 14/18* (2006.01)
*B01J 35/00* (2006.01)

(52) U.S. Cl.
CPC .......... *C23C 14/0036* (2013.01); *C23C 14/08* (2013.01); *C23C 14/14* (2013.01); *C23C 14/165* (2013.01); *C23C 14/185* (2013.01); *C23C 14/35* (2013.01); *C23C 14/352* (2013.01); *B01J 35/0033* (2013.01)

(56) References Cited

U.S. PATENT DOCUMENTS

| | | | | |
|---|---|---|---|---|
| 5,820,994 | A | * | 10/1998 | Gotoh .................. B32B 15/08 428/451 |
| 5,906,716 | A | * | 5/1999 | Mertesdorf ............. C25B 9/10 204/296 |
| 2013/0052370 | A1 | | 2/2013 | Cavarroc et al. |

FOREIGN PATENT DOCUMENTS

| | | |
|---|---|---|
| RU | 2 428 516 C2 | 9/2011 |
| RU | 2 455 070 C1 | 7/2012 |
| RU | 2 495 158 C1 | 10/2013 |
| WO | WO 99/19066 A1 | 4/1999 |

OTHER PUBLICATIONS

Maya, L., et al; "Porous platinum electrodes derived from the reduction of sputtered platinum dioxide films"; *Journal of Applied Electrochemistry*, vol. 29, pp. 883-888 (1999).

Neff, H., et al; "Structural, optical, and electronic properties of magnetron-sputtered platinum oxide films"; *AIP Journal of Applied Physics*, vol. 79 (10), p. 7672-7675 (1996).

Fedotov, A.A., et al; "Characterization of carbon-supported platinum nano-particles synthesized using magnetron sputtering for application in PEM electrochemical systems"; *International Journal of Hydrogen Energy*; vol. 38, pp. 426-430 (2013).

Fedotov, A.A., et al; "Plasma-assisted Pt and Pt—Pd nano-particles deposition on carbon carriers for application in PEM electrochemical cells"; *International Journal of Hydrogen Energy*, vol. 38, pp. 8568-8574 (2013).

Nefedkin, S.I., et al; "Investigation of catalytic vacuum black in the electrodes low-temperature electrochemical devices"; *Journal of Physics: Conference Series*, 2011, vol. 291, No. 1 [on-line] retrieved from the internet: URL: www:http://iopscience.iop.org/1742-6596/291/1/012003, abstract, p. 1-2, section 2.1, fig. 1, p. 3-5, section 3.1, fig. 3-5, p. 9-10, section 1.2, fig. 8, 9, conclusion.

Damaskin, B.B., et al; *Electrochemistry*, Moscow: Higher School, p. 151 (1987).

Korovin, N. V., Fuel Cells and Electrochemical Power Units, Moscow: MEI Publishing House, p. 280 (2005).

\* cited by examiner

METHOD OF PREPARING PLATINUM-BASED CATALYST AND PLATINUM-BASED CATALYST

This application is the U.S. National Phase of International Application No. PCT/RU2014/000401 filed May 30, 2014, the entire contents of each of which are hereby incorporated by reference.

FIELD OF THE INVENTION

The present invention relates to the applied electrochemistry, specifically to production methods of catalysts based on nano-size platinum and its compositions with other components. These catalysts are used in electrodes of electrochemical devices, such as fuel cells and electrolysis cells.

BACKGROUND ART

Platinum is known to be a highly active catalyst of many low-temperature electrochemical processes. Notwithstanding its high price, platinum can be excluded from the composition of electrodes in most cases, especially if they are used in acidic conditions (B. B. Damaskin, O. A. Petriy. Electrochemistry. Moscow: Higher School, 1987, 151 p., N. V. Korovin, Fuel cells and electrochemical power units. Moscow: MEI Publishing House, 2005. 280 p.). For instance, this refers to the technology of fuel cells and electrolysis cells for water decomposition with a hard polymeric electrolyte.

Most known methods of catalyst production for fuel cells with a hard polymeric electrolyte with nano-particles of platinum alloys on a carbonic carrier are chemical, e.g., through reduction of platinum salts and transition elements on a carbon carrier from a solution (RF patent No. 2367520, NanoKhim LLC, published on 20 Sep. 2009, IPC B01J23/42). There are electrochemical methods of platinum application onto the carbon carrier (RF patent No. 2455070, N. V. Smirnova et al., published on 10 Jul. 2012, IPC B01J37/34). There are also physical methods to form catalysts of electrodes of electrochemical devices based on platinum on the carbon carrier (RF patent No. 2421849, Institution of the Russian Academy of Sciences Physics and Technology Institute named after A. F. Yoffe, published on 20 Jun. 2011, IPC H01M4/88).

In all the above examples, the catalyst obtained on a carrier (soot) is applied using an air brush on an inert substrate to obtain a fuel cell electrode. Disadvantages of these methods include the use of toxic organic solvents, complexity and high number of production stages, irrational use and platinum carry-over when sputtering, which finally prevents from reaching high specific catalytic activity.

In order to avoid the above drawback, recently magnetron sputtering in vacuum has been applied to obtain a catalyst with low platinum concentration. It has been found that this technology known for a long time allows producing a coat by exclusive bonding on various surfaces with high continuity, irregularity and repeatability of the composition of the deposited layer. The conditions prevalent in magnetron sputtering have a special impact on electrochemical properties of manufactured electrodes.

A similar approach has been used in RF patent No. 2428516, FGUP CNII KN Prometey, published on 10 Sep. 2011, IPC C23C14/35, in order to produce electrodes for electrochemical treatment of water media including catalyst sputtering on a substrate made of inert material, such as titanium, in a vacuum chamber in a gas medium containing oxygen. According to the invention, the metallic substrate is pre-heated in vacuum to 400-450° C., then the metallic composition of the system (Ti—Ru), (Ti—Ru—Ir), (Zr—Ru) is spattered by magnetron method in a medium containing flame-forming argon gas and oxygen reaction gas, argon pressure being maintained constant during the entire sputtering process, and partial oxygen pressure being varied according to the linear law from 0 to $8 \times 10^{-2}$ Pa for 10 minutes, and when the oxygen pressure stabilizes, the described catalytic composition is sputtered to achieve the required coating thickness. The magnetron current density exceeds $0.20$ A/cm$^2$. This method allows producing a coating showing high adhesion of the catalytic coat to the carrier. A disadvantage of this method for producing electrodes of fuel cells and electrolytic cells is that the catalytic coating produced is dense and has no developed electrochemical surface. This occurs because catalyst particles on the heated substrate have high energy and are rapidly grouped in dense layers during catalyst formation. Using such catalytic layers in fuel cells and catalytic cells with hard polymeric electrolyte is inefficient, since it prevents from reaching high power densities (for a fuel cell) and low energy consumption (for water electrolysis). It is intended to use as anodes in devices for electrochemical treatment of water media and cathode protection.

According to US Patent Application No. 20130052370, DREUX AGGGLOMIRATION, published on 28 Feb. 2013, IPC H01M4/88, there is a method of applying a catalytic layer on a substrate to produce electrodes of fuel cells to ensure improved catalytic efficiency. The catalytic layer is obtained by sputtering of ionized plasma in vacuum when the catalyst in ionized form is applied on the substrate. For this purpose, the substrate is placed in a vacuum chamber where a cathode supporting the target containing the catalyst is also placed. Plasma is preferably generated from argon, supposedly with addition of low amount of hydrogen, nitrogen, oxygen and/or inert gases. The argon pressures is $10^{-3}$ to 1 Mbar (which corresponds to 0.1-100 Pa). The plasma is generated by magnetron. For sputtering, all possible combinations of clean targets and/or alloys can be used either alternately (at least from two targets) or simultaneously (at least from two targets). As a catalyst, platinum, palladium, platinum alloys, non-platinum metals, alloys thereof, nitrides or oxides thereof can be used.

This application contains no evidential information concerning the parameters and methods of catalyst production (platinum evaporation parameters in vacuum, density of UHF exposure, etc.). Only the frequency of 13.56 MHz is specified, which is known in the prior art and used in magnetron sprayers, along with 2.4 GHz used in household microwave ovens (http://electrik.info/main/fakty/666-mnogolikaya-mikrovolinovka-gotovit-pischae-izluchaet-mify.html http://avacuum.ru/rus/components/magnetrons/).

There is also no justification to the facts of producing a catalyst with high activity. Only the maximum specific power of the fuel cell with a hard polymeric electrolyte (PEM FC) of 0.855 W/cm$^2$ and platinum specific charging of 0.038 mg of Pt/cm$^2$ are given. No conditions of membrane-electrode blocks are given (temperature, pressure, composition and amount of catalyst on anode and cathode, membrane and gas-diffusion layer parameters, amount of the ion meter in the catalytic layer), and no conditions to obtain such high values are given (temperature, pressure and humidity of gases, voltage-current characteristic). According to the above, it should be noted that it is impossible to obtain data on specific activity of catalytic layers obtained by the method known in the art.

According to U.S. Pat. No. 3,773,639, published on 20 Nov. 1973, IPC C23C15.00 (prototype), there is a method of applying precious metals or their oxides on a metallic substrate by cathodic sputtering in such a way that the substrate's electrochemical activity is increased. The metallic substrate is bombarded with ions in reduced pressure residual atmosphere of pure rare gas (at the partial pressure of 5.33-6.67 Pa), and until high temperature falls down, a precious metal or its oxide is applied on the substrate by cathode sputtering. The sputtering includes two stages at 3000 V and 1.8-2.0 W/cm$^2$. The first stage is performed at 300-500° C. for 30 seconds to 5 minutes in a reduced pressure residual atmosphere of pure rare gas, and the second stage is done for 2-30 minutes in the atmosphere of rare gas and oxygen at the oxygen partial pressure from 0.1 to 25%. Introducing oxygen at this stage allows applying a precious metal (or its oxide) in microcrystalline or porous form with a large specific surface area. Tantalum, zirconium, niobium, titanium or their alloys are used as a substrate. As a precious metal for sputtering, platinum, iridium, palladium, ruthenium, osmium, rhodium and their alloys are selected, individually or in combination.

Along with that, power ranges at the second stage of sputtering in the oxygen atmosphere in the patent are too high and prevent from producing a nano-dispersive structure of the platinum catalyst. The oxygen content (0.1-25%), especially in combination with higher power, is insufficient to obtain a nano-structured catalyst with a large specific surface area and low platinum content. This technical solution based on the technology of metal cathodic sputtering is intended to produce thick catalytic layers (0.1-1 μm) on the inert metal surface (substrate) having an electrical valve-like action. The primary task of the first stage of application is to reduce the contact resistance and apply a dense coat, and that of the second stage is to apply a coat 0.1 to 1 μm thick (100-1000 nm) with increased dispersity. As seen from the above examples, this electrode is used as an electrolytic cell anode to produce gaseous chlorine. These catalytic coats are formed on inert metals (titanium, niobium, tantalum) and the catalytic coating with platinum microstructure allows reducing anode polarization.

DISCLOSURE OF INVENTION

The common task of the proposed group of inventions is to create a new high-capacity and repeatable method to produce platinum-based catalytic coats of new design to reduce the content of precious metals (first of all, platinum) and to increase the specific capacity of electrochemical devices.

A general technical result achieved when using the group of inventions is the increased specific catalytic activity of the electrode's catalytic coating for electrochemical devices (fuel cells and electrolysis cells).

This task and the required technical result are achieved in that the method of producing a platinum-based catalyst is used comprising pre-cleaning of the carrier with ion etching and further magnetron sputtering from at least one target based on platinum in vacuum in the primary gas plasma with an addition of reactive gas, where, according to the invention, the sputtering is done with the power density on the magnetron sputtered target within (0.004-0.17)*10$^5$ W/m$^2$ and the ratio of concentrations of primary and reaction gases of 75-99%, with the sputtering done at the reactive gas residual pressure of 6.7-20 Pa, and as a primary gas, either argon, nitrogen, hydrogen, helium or their possible combination is used, preferably argon, and in that oxygen, nitrogen, air or any possible combination thereof is used as a reaction gas, preferably oxygen, and in that at least one additional target and/or a combined target based on metal selected from a group comprising palladium, iridium, ruthenium, tungsten, zirconium, niobium, tantalum, antimony, tin, molybdenum, nickel, cobalt, silica, graphite and/or oxides thereof is used, and in that an intermediate layer of catalyst carrier based on titanium, niobium and tantalum, palladium, ruthenium, tungsten, zirconium, antimony, tin, molybdenum, nickel, cobalt and/or alloys thereof and/or oxides thereof is additionally applied before platinum application, preferably in vacuum by magnetron sputtering.

This task and the required technical result are also achieved by that the platinum-based catalyst is produced by the proposed method according to the invention.

Unlike the prototype, the proposed method of application ensures super-fine highly-dispersive nano-structured platinum-based coats to be applied, having the specific platinum content from 50 to 300 μg/cm$^2$ and the thickness from 7 to 50 nm. These coats are produced at high concentrations of reaction gas (electronegative gas) when in the conditions of low densities of application powers (below 0.17*10$^5$), negatively charged ions with high concentration (energy) are formed, move in the electrical field towards the substrate and affect it to create the conditions for a thin highly-dispersive structure of platinum catalyst to be formed, with a large specific surface area and high electrochemical activity. Such structures based on platinum and its compositions are used in the technology of fuel cells and water electrolysis by a hard polymeric electrolyte.

EMBODIMENT OF INVENTION

Figure 1A:
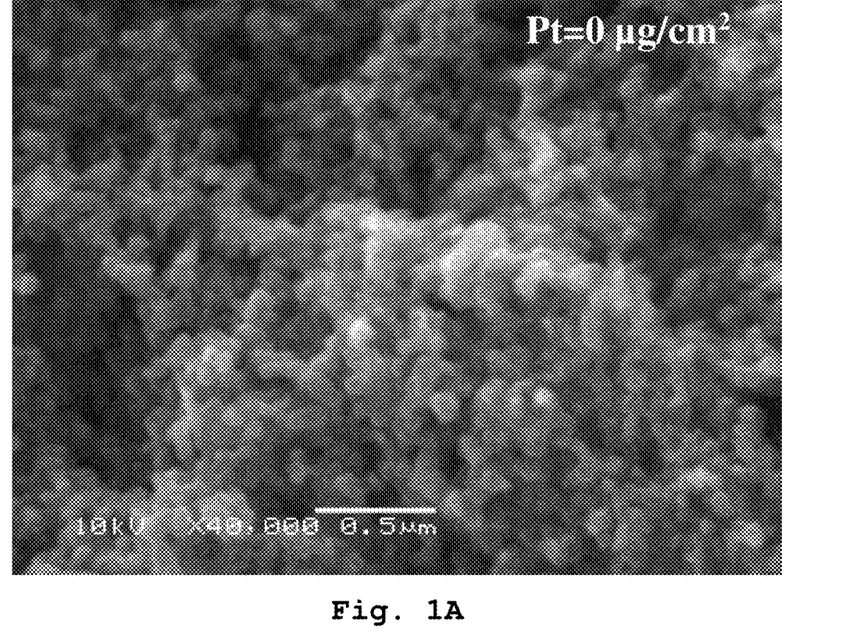
FIGS. 1A-1D show enlarged images of the front surface of nano-dispersive platinum surface samples on a soot micro-porous layer of carbonic gas-diffusion paper Freudenberg H2315-C2 with the specific platinum content of 22 μg/cm$^2$ (B) and 150 μg/cm$^2$ (C,D), and a carbon paper with no platinum applied (A). These pictures were taken with an electronic microscope JSM-6390 LA (JEOL USA, Inc.).
Figure 1B:
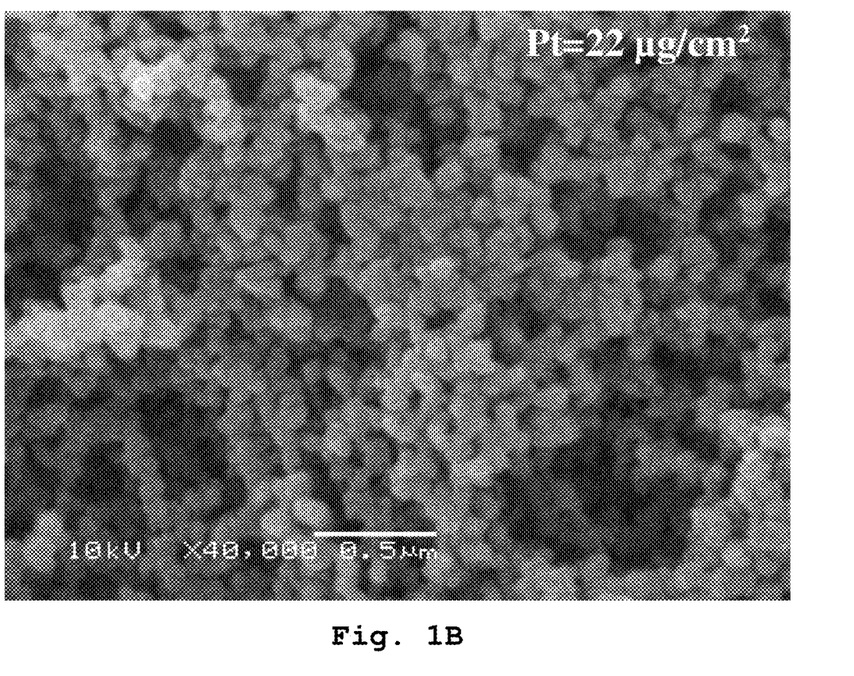
Figure 2:
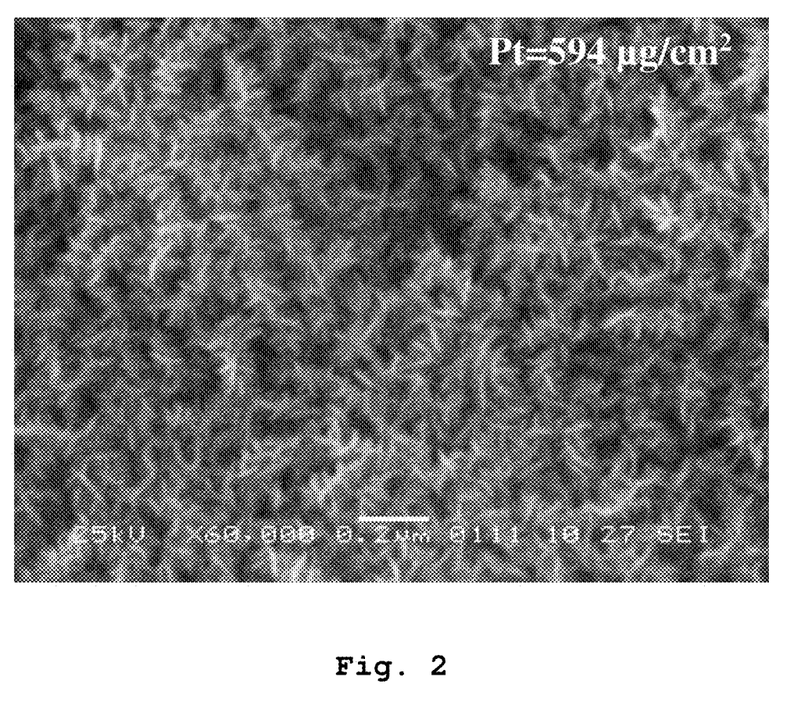
FIG. 2 shows electronic pictures of the titanium-based platinum catalyst with the coat of 594 μg/cm$^2$ (×40000).

As seen in FIG. 1A, the initial structure of the microporous coating based on soot represents large formations 500-800 nm in size consisting of soot spherical particles up to 100 nm in size. Application of dispersive platinum on this surfaces results in gradual enlargement of particles. It means that the formation of the platinum dispersive coating and its growth starts and occurs directly on the surface of soot particles. It can be seen that this growth results in increased diameter of soot particles due to sedimentation of dispersive platinum. Prominent change in particles diameters is observed starting with the charge of 20 μg/cm$^2$ (FIG. 1B), and for the charge of 300 μg/cm$^2$, the diameter of produced particles exceeds the diameter of soot particles by 2-3 times due to the formation of the black soot on the surface (not shown in drawings). The dispersive platinum characteristic color is black. When the platinum charge is increased to above 500 μg/cm$^3$, platinum particles become able to group into fine nano-fibers (FIG. 2).

The structure of such coats represents a combination of fibers whose length and thickness are increased together with the platinum specific content. When the charge exceed 2500 μg/cm$^2$, their thickness is 10-14 nm, and the length is 200-300 nm. Irrespective of the platinum content, all coats had a characteristic black color, which indicates their large specific surface area.

As one or several platinum components within the mixed catalyst, palladium, iridium, ruthenium, tungsten, zirconium, niobium, tantalum, antimony, tin, molybdenum, nickel, cobalt, silica, graphite and their oxides are used. To produce mixed catalysts, the sputtering is done from one or more targets, one of which is based on platinum. For this purpose, combined targets of the above materials are used. The flows of the sputtered coat can be directed to the substrate, or the substrate can move relative to the targets by using a carousel mechanism. The composition and structure of the catalyst is adjusted by changing the process parameters: magnetron current, substrate moving speed relative to the magnetron, substrate inclination angle relative to the magnetron target, ratios of areas of the combined target of the sputtered material.

In order to enhance the platinum bonding with the electrode surface, such as a soot-based surface, an intermediate layer of the catalyst is applied, preferably by magnetron sputtering in vacuum, followed by catalyst and carrier layers applied in series. As an intermediate layer material, titanium, niobium and tantalum, their alloys and oxides are used.

As a primary gas, nitrogen, hydrogen, helium, argon or any possible combination thereof is used. Preferably, argon is used.

As a reaction gas, oxygen, nitrogen, air or any possible combination thereof is used. If electronegative gases are used in relative sputtering (such as nitrogen or oxygen), negatively charged ions are formed. Oxygen is the preferable reaction gas. By means of oxide formation on the target surface, it affects the speed of target sputtering, and, consequently, design features of catalyst's dispersive structures with low energies of platinum particles.

During magnetron platinum DC sputtering, the range of positively charge ions in the mixture of argon and oxygen is vast and includes $Ar^+$, $Ar^{+2}$ ions (possible ionized platinum oxides). All positive ions are formed in the plasma volume, since otherwise they would accelerate back towards the target in the dark cathode space (p. 107, E. V. Berlin, L. A. Seydman. Plasma ion processes in thin-film technology. Moscow: Teckhnosfera, 2010. Pp. 528).

Unlike positive ions, the range of negatively charged ions is much simpler. It contains only oxygen ions $O^{2-}$, $O^-$ (possible ionized platinum oxides). Unlike positive ions, negative ones are accelerated by cathode potential and acquire several hundreds of electron volts. When comparing the fluxes of positive and negative ions, it can be noted that the flux of positively charged ions exceeds the flux of negatively charged ones by 1-2 orders. However, thanks to their high energy, negative ions can produce defects in the film and cause re-sputtering of atoms from the surface of growing film, which promotes the formation of the dispersive structure. The number of negatively charged ions increases with the oxygen partial pressure in the chamber—not directly proportional, but much faster. This is caused by oxide formation on the substrate surface.

In this manner, the oxide on the platinum target affects the intensity and composition of the platinum atomic steam obtained by means of bombarding the target surface with $Ar^+$ ions. The formation of electronegative gas negative ions can produce defects in the film and cause re-sputtering of atoms from the surface of growing film, which promotes the formation of the dispersive structure.

In order to illustrate various aspects of the invention embodiment, below are examples of the suggested method embodiment that are explanatory only and not restrictive of the disclosure. Selective, examples from Table 1 are described below. In examples 1-6, the specific activity in Table 1 is given for a catalytic coating on a titanium substrate.

Example 1. Manufacturing an Electrode-Catalyst for a Fuel Cell

By using a platinum target (P199.93) 1 mm thick and Kraudion 1M magnetron sputtering unit, the platinum nanostructured coating was applied on the surface of the soot low-porous layer of Freudenberg H2315-C2 carbon paper and of the titanium foil in order to determine the catalyst's activity and specific surface area. The air was removed from the chamber until reaching the partial pressure below $2\times10^{-3}$ Pa. The vacuum chamber was then charged with a plasma-forming gas—argon—until reaching the pressure of 1.7 Pa, which was maintained at the given level during the entire sputtering process. The substrates were then subjected to ion etching by a flux of argon ions with the average energy up to 1.5 keV. Then platinum target was then exposed to voltage and a plasma charge with the power density of $(0.004)*10^5$ $W/m^2$ was excited. This was followed by the oxygen reaction gas supplied to the vacuum chamber until reaching 7 Pa. The oxygen percentage was 77%. With the fixed oxygen pressure and stabilized sputtering process, the protective screen was opened and the platinum was sputtered on the surface of the low-porous layer of the carbon paper and of the titanium foil. The process took 400 seconds. The platinum specific content was 21.6 $\mu g/cm^2$. The oxygen activity was then determined. The catalyst specific activity (according to the specific current of adsorbed hydrogen oxidation) was 26.1 A/g of Pt. The titanium-based catalyst activity was determined by a potentiodynamic method in 0.5 M $H_2SO_4$ within a three-electrode electrochemical cell. The activity criterion was the maximum oxidation peak of adsorbed hydrogen reduced to the amount of platinum in the catalyst. This specific current reliably characterizes the catalyst's electrochemical surface, which is proportional to the electrode activity when working in the fuel cell.

Example 2. Manufacturing an Electrode-Catalyst for a Fuel Cell

By using a platinum target (P199.93) 1 mm thick and Kraudion 1M magnetron sputtering unit, the platinum nanostructured coating was applied on the surface of the soot low-porous layer of Freudenberg H2315-C2 carbon paper and of the titanium foil in order to determine the catalyst's activity and specific surface area. The air was removed from the chamber until reaching the partial pressure below $2\times10^{-3}$ Pa. The vacuum chamber was then charged with a plasma-forming gas—argon—until reaching the pressure of 1.7 Pa, which was maintained at the given level during the entire sputtering process. The substrates were then subjected to ion etching by a flux of argon ions with the average energy up to 1.5 keV. The platinum target was then exposed to voltage and a plasma charge with the power density of $(0.021)*10^5$ $W/m^2$ was excited. This was followed by the oxygen reaction gas supplied to the vacuum chamber until reaching 7 Pa. The oxygen percentage was 77%. With the fixed oxygen pressure and stabilized sputtering process, the protective screen was opened and the platinum was sputtered on the surface of the low-porous layer of the carbon paper and of the titanium foil. The process took 80 seconds. The platinum specific content was 22 $\mu g/cm^2$. The oxygen activity was then determined. The catalyst specific activity (according to the specific current of adsorbed hydrogen oxidation) was 29.8 A/g of Pt. The titanium-based catalyst activity was determined by a potentiodynamic method in 0.5 M $H_2SO_4$ within a three-electrode electrochemical cell. The activity criterion was the maximum oxidation peak of adsorbed hydrogen reduced to the amount of platinum in the catalyst. This specific current reliably characterizes the catalyst's electrochemical surface, which is proportional to the electrode activity when working in the fuel cell. The photographs of the platinum catalyst sputtered on the soot substrate are given in FIG. 1(A,B).

Example 3. Manufacturing an Electrode-Catalyst for a Fuel Cell

By using a platinum target (P199.93) 1 mm thick and Kraudion 1M magnetron sputtering unit, the platinum nanostructured coating was applied on the surface of the soot low-porous layer of Freudenberg H2315-C2 carbon paper and of the titanium foil in order to determine the catalyst's activity and specific surface area. The air was removed from the chamber until reaching the partial pressure below $2\times10^{\times3}$ Pa. The vacuum chamber was then charged with a plasma-forming gas—argon—until reaching the pressure of 1.7 Pa, which was maintained at the given level during the entire sputtering process. The substrates were then subjected to ion etching by a flux of argon ions with the average energy up to 1.5 keV. The platinum target was then exposed to voltage and a plasma charge with the power density of $(0.017)*10^5$ W/m$^2$ was excited. This was followed by the oxygen reaction gas supplied to the vacuum chamber until reaching 7 Pa. The oxygen percentage was 77%. With the fixed oxygen pressure and stabilized sputtering process, the protective screen was opened and the platinum was sputtered on the surface of the low-porous layer of the carbon paper and of the titanium foil. The process took 10 seconds. The platinum specific content was 21.4 μg/cm$^2$. The oxygen activity was then determined. The catalyst specific activity (according to the specific current of adsorbed hydrogen oxidation) was 17.0 A/g of Pt. The titanium-based catalyst activity was determined by a potentiodynamic method in 0.5 M H$_2$SO$_4$ within a three-electrode electrochemical cell. The activity criterion was the maximum oxidation peak of adsorbed hydrogen reduced to the amount of platinum in the catalyst. This specific current reliably characterizes the catalyst's electrochemical surface, which is proportional to the electrode activity when working in the fuel cell.

Example 22. Manufacturing an Electrode-Catalyst for a Fuel Cell

Figure 1C:
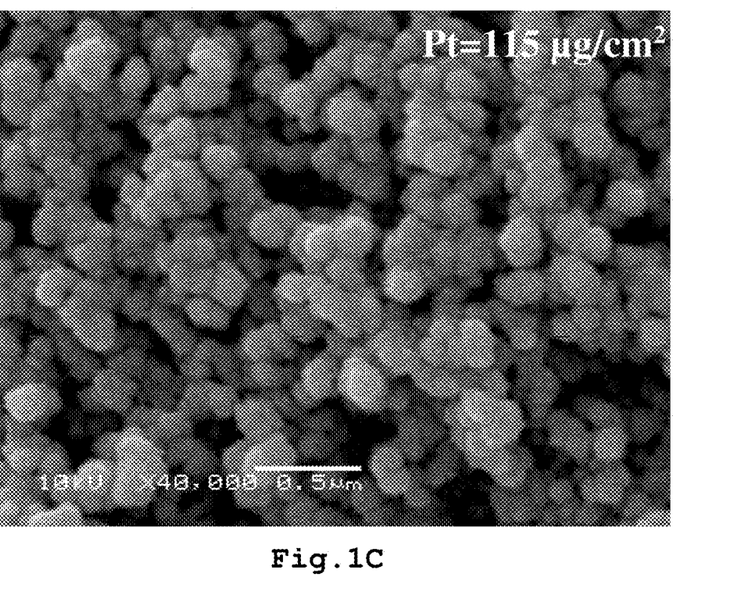
Figure 1D:
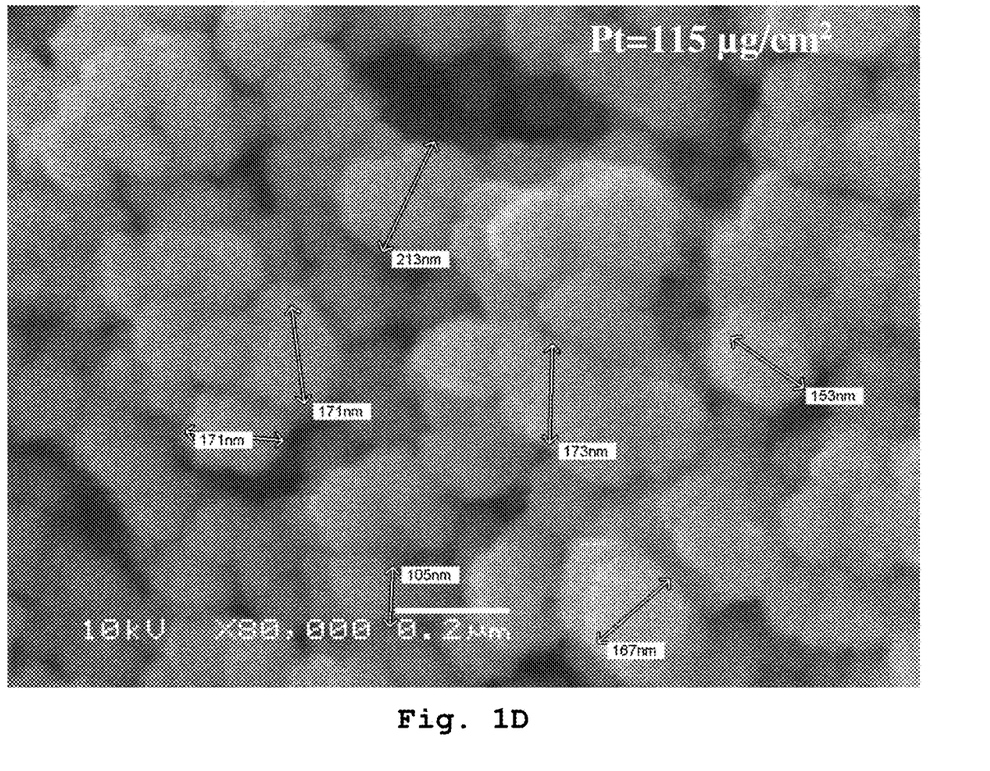

By using a platinum target (P199.93) 1 mm thick and Kraudion 1M magnetron sputtering unit, the platinum nanostructured coating was applied on the surface of the soot micro-dispersive layer of Freudenberg H2315-C2 carbon paper and of the titanium foil in order to determine the catalyst's activity and specific surface area. The air was removed from the chamber until reaching the partial pressure below $2\times10^{-3}$ Pa. The vacuum chamber was then charged with a plasma-forming gas—argon—until reaching the pressure of 1.7 Pa, which was maintained at the given level during the entire sputtering process. The titanium substrate was then subjected to ion etching by a flux of argon ions with the average energy up to 1.5 keV. The platinum target was then exposed to voltage and a plasma charge with the power density of $(0.021)*10^5$ W/m$^2$ was excited. This was followed by the oxygen reaction gas supplied to the vacuum chamber until reaching 7 Pa. The oxygen percentage was 77%. With the fixed oxygen pressure and stabilized sputtering process, the protective screen was opened and the platinum was sputtered on the surface of the low-porous layer of the carbon paper and of the titanium foil. The process took 240 seconds. The platinum specific content was 151.5 μg/cm$^2$. The oxygen activity was then determined. The catalyst specific activity (according to the specific current of adsorbed hydrogen oxidation) was 26.1 A/g of Pt. The photographs of the catalyst on titanium foil are given in FIG. 1(C,D).

Example 26. Manufacturing an Electrode-Catalyst for an Electrolysis Cell

By using a platinum target (P1 99.93) 1 mm thick and Kraudion 1M magnetron sputtering unit, the platinum nanostructured coating was applied on the titanium surface. The air was removed from the chamber until reaching the partial pressure below $2\times10^{-3}$ Pa. The vacuum chamber was then charged with a plasma-forming gas—argon—until reaching the pressure of 1.7 Pa, which was maintained at the given level during the entire sputtering process. The titanium substrate was then subjected to ion etching by a flux of argon ions with the average energy up to 1.5 keV. The platinum target was then exposed to voltage and a plasma charge with the power density of $(0.021)*10^5$ W/m$^2$ was excited. This was followed by the oxygen reaction gas supplied to the vacuum chamber until reaching 7 Pa. The oxygen percentage was 77%. With the fixed oxygen pressure and stabilized sputtering process, the protective screen was opened and the platinum was sputtered on the titanium surface. The process took 640 seconds. The platinum specific content was 594 μg/cm$^2$. The catalyst specific activity (according to the specific current of adsorbed hydrogen oxidation) was 18.3 A/g of Pt. The photographs (×60000) of the titanium-based catalyst are given in FIG. 2. It can be seen that when the platinum content increases, filiform platinum formations start forming on the titanium surface.

The catalyst activity test results for other conditions are given in Table 1.

TABLE 1

Catalyst activity test results for a catalyst produced using the proposed method.

| Substrate | Example No. | Catalyst material | Power density on the sputtered target, $\cdot 10^5$ w/m$^2$ | Chamber pressure, Pa | Catalyst's specific content (Pt), μg/cm$^2$ | Oxygen percentage, % | Specific activity (according to the Specific current of adsorbed hydrogen oxidation), A/g of Pt |
|---|---|---|---|---|---|---|---|
| Soot, | 1 | Pt | 0.004 | 7 | 21.6 | 77 | 26.1 |
| titanium | 2 | Pt | 0.021 | 7 | 22.0 | 77 | 29.8 |

TABLE 1-continued

Catalyst activity test results for a catalyst produced using the proposed method.

| Substrate | Example No. | Catalyst material | Power density on the sputtered target, ·10⁵ w/m² | Chamber pressure, Pa | Catalyst's specific content (Pt), μg/cm² | Oxygen percentage, % | Specific activity (according to the Specific current of adsorbed hydrogen oxidation), A/g of Pt |
|---|---|---|---|---|---|---|---|
| | 3 | Pt | 0.17 | 7 | 21.4 | 77 | 17 |
| | 4 | Pt | 0.18 | 7 | 17 | 77 | 16.1 |
| | 5 | Pt | 0.003 | 7 | 21.2 | 77 | 25.3 |
| | 6 | Pt | 0.018 | 7 | 21.0 | 77 | 16.1 |
| | 7 | Pt | 0.021 | 7 | 20.8 | 0 | 11.1 |
| | 8 | Pt | 0.021 | 7 | 20.6 | 50 | 27.5 |
| | 9 | Pt | 0.021 | 7 | 20.8 | 70 | 28.3 |
| | 10 | Pt | 0.021 | 7 | 22.0 | 75 | 29.5 |
| | 11 | Pt | 0.021 | 7 | 21.2 | 90 | 29.7 |
| | 12 | Pt | 0.021 | 7 | 20.6 | 99 | 29.3 |
| | 13 | Pt | 0.021 | 7 | 20.8 | 100 | 16.3 |
| | 14 | Pt | 0.021 | 6 | 21.4 | 77 | 21.0 |
| | 15 | Pt | 0.021 | 15 | 21.0 | 77 | 19.5 |
| | 16 | Pt | 0.021 | 20 | 21.2 | 77 | 17 |
| | 17 | Pt | 0.021 | 21 | 21 | 77 | 13.1 |
| | 18 | Pt | 0.021 | 7 | 150.4 | 0 | 11.7 |
| | 19 | Pt | 0.021 | 7 | 150.9 | 50 | 10.8 |
| | 20 | Pt | 0.021 | 7 | 151 | 70 | 22.9 |
| | 21 | Pt | 0.021 | 7 | 152.0 | 75 | 25.1 |
| | 22 | Pt | 0.021 | 7 | 151.5 | 77 | 26.1 |
| | 23 | Pt | 0.021 | 7 | 150.1 | 90 | 22.1 |
| | 24 | Pt | 0.021 | 7 | 149 | 99 | 21.3 |
| | 25 | Pt | 0.021 | 7 | 150.6 | 100 | 13.3 |
| | 26 | Pt | 0.021 | 7 | 594 | 77 | 18.3 |

As seen from the table, the sputtering within the power density on the mangetron's sputtered target within $(0.004-0.17)*10^5$ W/m² and the ratio of concentrations of primary and reaction gases of 75-99% ensures maximum catalyst activity (according to the specific current of adsorbed hydrogen oxidation). In this case, the activity is determined by forming a nano-porous morphology of the catalyst with developed internal surface of the platinum dispersive surface (FIGS. 1A-1D). Increasing the platinum embedding to the catalyst and adopting thick dispersive platinum surfaces (Example 26) results in decreased specific activity due to the formation of structures with larger platinum particles and fibers (FIG. 2).

When the power density on the sputtered target goes below $0.004*10^5$ W/m², the specific activity is not increased, but the time of catalyst application is unreasonably high, which makes the process lack its technological effectiveness. When the power density on the sputtered target goes above $0.17*10^5$ W/m², the specific activity is decreased, but the time of catalyst application is reduced so much that it makes the application process unsteady, e.g., it lacks technological effectiveness.

The oxygen concentration in the magnetron unit chamber going below the specified range (below 75%) causes the catalyst's specific activity to go down (Examples 7, 8, 9, 18, 19, 20). Increasing the oxygen concentration in the magnetron unit chamber above the specified range (above 75%) causes the catalyst's specific activity to go down due to the decreased concentration of the plasma-forming gas (Examples 13, 25).

The pressure in the magnetron unit chamber going below the specified range (below 6.7 Pa) causes the catalyst's specific activity to go down (Example 14). The pressure in the magnetron unit chamber going above the specified range (above 20 Pa) causes the catalyst's specific activity to go down (Example 17).

The essence of this invention is based on the synthesis effect on the substrate surface of dispersive nano-structured catalytic sediments of platinum and its compositions due to low interaction energies of sputtered platinum atoms and compositions thereof in the gas medium containing the optimal balance of plasma-forming (primary) and reactive (electronegative) gas and creating the conditions for the dispersive nano-structured sediments to grow.

The invention claimed is:

1. A method of platinum-based catalyst production comprising
   cleaning a carrier by ion etching and
   magnetron sputtering at least one target based on platinum in vacuum in a primary gas plasma with addition of reactive gas,
   wherein the sputtering is performed at a power density on the magnetron sputtered target within $(0.004-0.17)*10^5$ W/m² and a ratio of concentrations of the primary and reaction gas of 75-99%,
   wherein the sputtering results in a layer with a thickness from 7 to 50 nm, and
   wherein the layer is porous and has a specific platinum content of 17 to 594 μg/cm².

2. The method according to claim 1 wherein sputtering is done at the reaction gas residual pressure of 6.7-20 Pa.

3. The method according to claim 1 wherein argon, nitrogen, hydrogen, helium or any combination thereof is used as the primary gas.

4. The method according to claim 3 wherein argon is used.

5. The method according to claim 1 wherein oxygen, nitrogen, air or any possible combination thereof is used as the reaction gas.

6. The method according to claim 5 wherein oxygen is used.

7. The method according to claim 1 wherein at least one additional target and/or combined target based on metal selected from a group comprising palladium, iridium, ruthenium, tungsten, zirconium, niobium, tantalum, antimony, tin, molybdenum, nickel, cobalt, silica, graphite and/or oxides thereof is used during sputtering.

8. The method according to claim 1 wherein an intermediate catalyst layer is applied before platinum application, which is based on titanium, niobium and tantalum, palladium, ruthenium, tungsten, zirconium, antimony, tin, molybdenum, nickel, cobalt and/or alloys thereof and/or oxides thereof.

9. The method according to claim 8 wherein the intermediate layer is applied by magnetron sputtering.

10. A method of platinum-based catalyst production comprising
cleaning a carrier by ion etching and
magnetron sputtering at least one target based on platinum in vacuum in a primary gas plasma with addition of reactive gas,
wherein the sputtering is performed at a power density on the magnetron sputtered target within $(0.004\text{-}0.17)*10^5$ W/m$^2$ and a ratio of concentrations of the primary and reaction gas of 75-99%,
wherein the sputtering results in a layer with a thickness from 7 to 50 nm, and
wherein the layer is porous and has a specific platinum content of 50 to 300 μg/cm$^2$.

11. The method according to claim 10 wherein sputtering is done at the reaction gas residual pressure of 6.7-20 Pa.

12. The method according to claim 10 wherein argon, nitrogen, hydrogen, helium or any combination thereof is used as the primary gas.

13. The method according to claim 12 wherein argon is used.

14. The method according to claim 10 wherein oxygen, nitrogen, air or any possible combination thereof is used as the reaction gas.

15. The method according to claim 14 wherein oxygen is used.

16. The method according to claim 10 wherein at least one additional target and/or combined target based on metal selected from a group comprising palladium, iridium, ruthenium, tungsten, zirconium, niobium, tantalum, antimony, tin, molybdenum, nickel, cobalt, silica, graphite and/or oxides thereof is used during sputtering.

17. The method according to claim 10 wherein an intermediate catalyst layer is applied before platinum application, which is based on titanium, niobium and tantalum, palladium, ruthenium, tungsten, zirconium, antimony, tin, molybdenum, nickel, cobalt and/or alloys thereof and/or oxides thereof.

18. The method according to claim 17 wherein the intermediate layer is applied by magnetron sputtering.

* * * * *